United States Patent
Li et al.

(10) Patent No.: US 9,461,097 B2
(45) Date of Patent: Oct. 4, 2016

(54) OLED DISPLAY DEVICE AND MANUFACTURE METHOD THEREOF

(71) Applicant: Shenzhen China Star Optoelectronics Technology Co., Ltd., Shenzhen, Guangdong (CN)

(72) Inventors: Wenhui Li, Guangdong (CN); Yifan Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/428,970

(22) PCT Filed: Feb. 9, 2015

(86) PCT No.: PCT/CN2015/072546
§ 371 (c)(1),
(2) Date: Mar. 17, 2015

(87) PCT Pub. No.: WO2016/101393
PCT Pub. Date: Jun. 30, 2016

(65) Prior Publication Data
US 2016/0181331 A1    Jun. 23, 2016

(51) Int. Cl.
*H01L 27/32* (2006.01)
*H01L 51/50* (2006.01)
*H01L 51/52* (2006.01)
*H01L 51/56* (2006.01)

(52) U.S. Cl.
CPC ....... *H01L 27/3246* (2013.01); *H01L 27/3211* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/56* (2013.01)

(58) Field of Classification Search
CPC ............... H01L 27/3246; H01L 51/56; H01L 27/3211; H01L 51/5092; H01L 51/5056; H01L 51/5088; H01L 51/5206; H01L 51/5221; H01L 51/5072
See application file for complete search history.

(56) References Cited

U.S. PATENT DOCUMENTS

| 6,765,549 | B1* | 7/2004 | Yamazaki | G09G 3/3266 315/169.3 |
| 9,151,971 | B2* | 10/2015 | Wu | G02B 27/26 |
| 2014/0183540 | A1* | 7/2014 | Koyama | G09G 3/3225 257/72 |
| 2015/0357392 | A1* | 12/2015 | You | H01L 27/3223 257/40 |

* cited by examiner

Primary Examiner — John P Dulka
(74) Attorney, Agent, or Firm — Andrew C. Cheng

(57) ABSTRACT

The present invention provides an OLED display device and a manufacture method thereof. The OLED display device comprises: a substrate (100); a plurality of first electrodes (200), spaced with one another and arranged in array on the substrate (100); pixel barrier layers (300), located on the substrate (100) and between every two adjacent first electrodes (200); each pixel barrier layer (300) comprises a rut (310) at center, and the rut (310) penetrates the pixel barrier layer (300); an OLED organic material layer (400), located on the first electrodes (200) and the pixel barrier layers (300); the OLED organic material layer (400) is disconnected at the ruts (310); a second electrode (500), located on the OLED organic material layer (400); the second electrode (500) is similarly disconnected at the ruts (310). The OLED display device can inhibit the leaking emitting light problem caused by the leakage current. The short circuit defects can be decreased, and the reliability of the OLED display device is promoted and the display quality of the OLED display device is improved.

11 Claims, 2 Drawing Sheets

OLED DISPLAY DEVICE AND MANUFACTURE METHOD THEREOF

FIELD OF THE INVENTION

The present invention relates to a display technology field, and more particularly to an OLED display device and a manufacture method thereof.

BACKGROUND OF THE INVENTION

In recent years, Liquid Crystal Display (LCD), Organic Light Emitting Diode (OLED) and other panel display devices have been gradually replaced the CRT displays and become the major production in the display device market. The OLED possesses many outstanding properties of self-illumination, low driving voltage, high luminescence efficiency, fast response, high clarity and contrast, near 180° view angle, wide range of working temperature, applicability of flexible display and large scale full color display. The OLED is recognized as the most potential flat panel display by industry.

The OLED display device generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED is that the illumination generates due to the carrier injection and recombination under the electric field driving of the semiconductor material and the organic semiconductor illuminating material. Specifically, the ITO transparent electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

In recent years, the spaces between the pixels gradually get smaller with the higher resolution of the displays and the pixels per inch (ppi) increase of the pixels. Meanwhile, with the efficiency of the luminescent material of the OLED display device is raised, the high brightness with low current and low voltage can be realized to reduce the power consumption, accordingly. However, just due to the high efficiency of the luminescent material of the OLED display device, which can light with a small current conducted, a tiny current leaked from one pixel to another adjacent pixel can cause the aforesaid high efficient luminescent material to light, the adjacent pixel which should not light may emit light often. The emitting light due to the leakage current is so called the leaking emitting light. The color mixture will occur and change the color coordinates if the leaking emitting light happened. Besides, as the leaking emitting light due to the leakage current happens in the low brightness area, the black brightness will increase.

Aiming at this problem, the leaking emitting light can be inhibited by reducing the efficiency of the luminescent material and degrading the resolution of the display device. Nevertheless, with the constantly increasing demands for the productions of the low power consumption and high resolution from the users, the leaking emitting light problem has to be solved under circumstance that the efficiency of the luminescent material is not reduced and the resolution of the display device is not degraded.

SUMMARY OF THE INVENTION

An objective of the present invention is to provide an OLED display device, of which the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved.

Another objective of the present invention is to provide a manufacture method of an OLED display device, of which the manufacture method does not damage the first auxiliary light emitting layer, and decrease the interface issues, and the leaking emitting light caused problem by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved.

For realizing the aforesaid objectives, the present invention provides an OLED display device, comprising:

a substrate;

a plurality of first electrodes, spaced with one another and arranged in array on the substrate;

pixel barrier layers, located on the substrate and between every two adjacent first electrodes; the pixel barrier layers are higher than the first electrodes and partially cover upper surfaces of the first electrodes; each pixel barrier layer comprises a rut at center, and the rut penetrates the pixel barrier layer; an area defined by the every two adjacent pixel barrier layers is one pixel area;

an OLED organic material layer, located on the first electrodes and the pixel barrier layers; the OLED organic material layer is disconnected at the ruts;

a second electrode, located on the OLED organic material layer; the second electrode is similarly disconnected at the ruts.

Material of the pixel barrier layers is insulation material.

The OLED organic material layer comprises: a first auxiliary light emitting layer, a second auxiliary light emitting layer and a light emitting layer located between the first, the second auxiliary light emitting layers.

The rut comprises: the first auxiliary light emitting layer located on the substrate, the second auxiliary light emitting layer located on the first auxiliary light emitting layer, the second electrode located on the second auxiliary light emitting layer inside; a depth of the rut is enough for accommodating the first auxiliary light emitting layer, the second auxiliary light emitting layer, the second electrode inside, and the second electrode which is a topside layer in the rut is still lower than an upper surface of the rut.

The light emitting layer comprises a red light emitting layer, a green light emitting layer, a blue light emitting layer which are orderly and circularly aligned.

The first electrode is an anode or a cathode, and correspondingly, the second electrode is a cathode or an anode.

The first auxiliary light emitting layer comprises a Hole Injection Layer and a Hole Transport Layer, or an Electron Injection Layer and an Electron Transport Layer, and correspondingly, the second auxiliary light emitting layer comprises an Electron Injection Layer and an Electron Transport Layer, or a Hole Injection Layer and a Hole Transport Layer.

The present invention further provides a manufacture method of an OLED display device, comprising steps of:

step 1, providing a substrate, and forming a first electrode layer, and patterning the first electrode layer to form a plurality of first electrodes, spaced with one another and arranged in array on the substrate;

step 2, forming a pixel barrier layer on the substrate and between every two adjacent first electrodes, and patterning each pixel barrier layer to form a rut penetrating the pixel barrier layer at center;

the pixel barrier layers are higher than the first electrodes and partially cover upper surfaces of the first electrodes; an area defined by the every two adjacent pixel barrier layers is one pixel area;

step 3, sequentially forming a first auxiliary light emitting layer, a light emitting layer and a second auxiliary light emitting layer on the first electrodes and the pixel barrier layers, and the first, the second auxiliary light emitting layers and the light emitting layer sandwiched between the two construct an OLED organic material layer; meanwhile, sequentially forming the first auxiliary light emitting layer on the substrate and the second auxiliary light emitting layer on the first auxiliary light emitting layer;

the first, the second auxiliary light emitting layers on the first electrodes and the pixel barrier layers and the first, the second auxiliary light emitting layers inside the ruts are naturally disconnected at the ruts;

step 4, forming a second electrode on the second auxiliary light emitting layer, and the second electrode is naturally disconnected at the ruts, similarly;

a depth of the rut is enough for accommodating the first auxiliary light emitting layer, the second auxiliary light emitting layer, the second electrode inside, and the second electrode which is a topside layer in the rut is still lower than an upper surface of the rut.

Material of the pixel barrier layers is insulation material.

The light emitting layer comprises a red light emitting layer, a green light emitting layer, a blue light emitting layer which are orderly and circularly aligned;

the first electrode is an anode or a cathode, and correspondingly, the second electrode is a cathode or an anode;

The first auxiliary light emitting layer comprises a Hole Injection Layer and a Hole Transport Layer, or an Electron Injection Layer and an Electron Transport Layer, and correspondingly, the second auxiliary light emitting layer comprises an Electron Injection Layer and an Electron Transport Layer, or a Hole Injection Layer and a Hole Transport Layer.

The present invention further provides a manufacture method of an OLED display device, comprising steps of:

step 1, providing a substrate, and forming a first electrode layer, and patterning the first electrode layer to form a plurality of first electrodes, spaced with one another and arranged in array on the substrate;

step 2, forming a pixel barrier layer on the substrate and between every two adjacent first electrodes, and patterning each pixel barrier layer to form a rut penetrating the pixel barrier layer at center;

the pixel barrier layers are higher than the first electrodes and partially cover upper surfaces of the first electrodes; an area defined by the every two adjacent pixel barrier layers is one pixel area;

step 3, sequentially forming a first auxiliary light emitting layer, a light emitting layer and a second auxiliary light emitting layer on the first electrodes and the pixel barrier layers, and the first, the second auxiliary light emitting layers and the light emitting layer sandwiched between the two construct an OLED organic material layer; meanwhile, sequentially forming the first auxiliary light emitting layer on the substrate and the second auxiliary light emitting layer on the first auxiliary light emitting layer;

the first, the second auxiliary light emitting layers on the first electrodes and the pixel barrier layers and the first, the second auxiliary light emitting layers inside the ruts are naturally disconnected at the ruts;

step 4, forming a second electrode on the second auxiliary light emitting layer, and the second electrode is naturally disconnected at the ruts, similarly;

a depth of the rut is enough for accommodating the first auxiliary light emitting layer, the second auxiliary light emitting layer, the second electrode inside, and the second electrode which is a topside layer in the rut is still lower than an upper surface of the rut;

wherein material of the pixel barrier layers is insulation material;

wherein the light emitting layer comprises a red light emitting layer, a green light emitting layer, a blue light emitting layer which are orderly and circularly aligned;

the first electrode is an anode or a cathode, and correspondingly, the second electrode is a cathode or an anode;

The first auxiliary light emitting layer comprises a Hole Injection Layer and a Hole Transport Layer, or an Electron Injection Layer and an Electron Transport Layer, and correspondingly, the second auxiliary light emitting layer comprises an Electron Injection Layer and an Electron Transport Layer, or a Hole Injection Layer and a Hole Transport Layer.

The benefits of the present invention are: the present invention provides an OLED display device, by locating the penetrating rut at the center of the pixel barrier layer to disconnect the OLED organic material layer at the rut, the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved; the present invention provides a manufacture method of an OLED display device, by patterning each pixel barrier layer to form the rut penetrating the pixel barrier layer at center, and sequentially and continuously forming the first auxiliary light emitting layer, the emitting layer and the second auxiliary light emitting layer of the OLED organic material layer after the pixel barrier layer is formed and at last, the second electrode is formed on the second auxiliary light emitting layer, on one hand, no damage occurs to the first auxiliary light emitting layer 401, and the interface issues are decreased, and on the other hand, the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
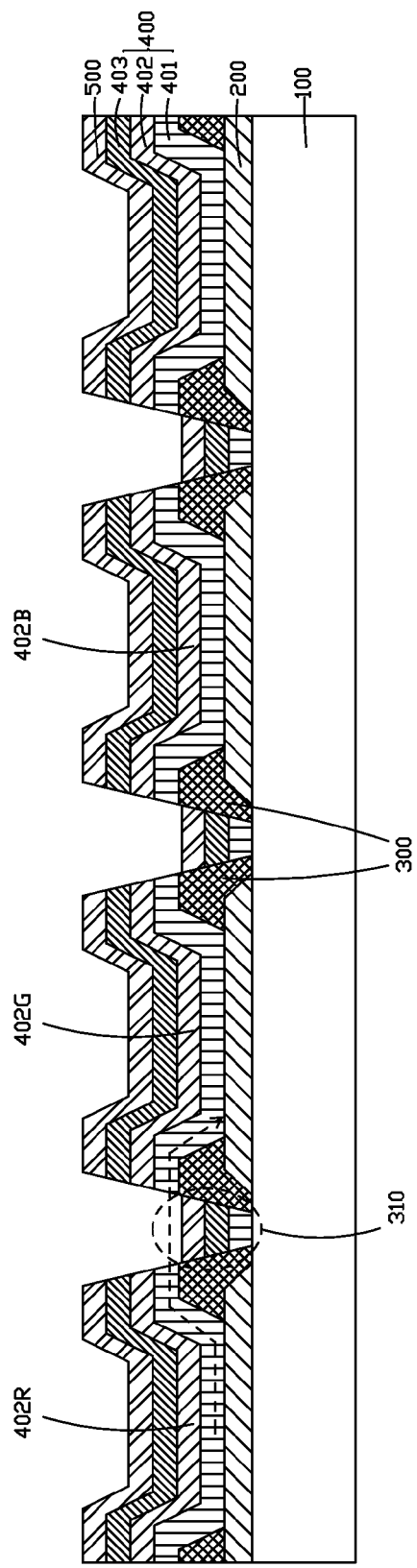
FIG. 1 is a sectional structure diagram of an OLED display device according to the present invention.

Please refer to FIG. 1. The present invention first provides an OLED display, comprising:

a substrate 100;

a plurality of first electrodes 200, spaced with one another and arranged in array on the substrate 100;

pixel barrier layers 300, located on the substrate 100 and between every two adjacent first electrodes 200; the pixel barrier layers 300 are higher than the first electrodes 200 and partially cover upper surfaces of the first electrodes 200; each pixel barrier layer 300 comprises a rut 310 at center, and the rut 310 penetrates the pixel barrier layer 300; an area defined by the every two adjacent pixel barrier layers 300 is one pixel area;

an OLED organic material layer 400, located on the first electrodes 200 and the pixel barrier layers 300; the OLED organic material layer 400 is disconnected at the ruts 310;

a second electrode 500, located on the OLED organic material layer 400; the second electrode 500 is similarly disconnected at the ruts 310.

Specifically, the substrate 100 is a glass substrate, preferably.

Material of the pixel barrier layers 300 is insulation material. Any proper insulation material in this field can be employed for the pixel barrier layers 300.

The OLED organic material layer 400 comprises: a first auxiliary light emitting layer 401, a second auxiliary light emitting layer 403 and a light emitting layer 402 located between the first, the second auxiliary light emitting layers 401, 403. The light emitting layer 402 further comprises a red light emitting layer 402R, a green light emitting layer 402G, a blue light emitting layer 402B which are orderly and circularly aligned.

The rut 310 further comprises: the first auxiliary light emitting layer 401 located on the substrate 100, the second auxiliary light emitting layer 403 located on the first auxiliary light emitting layer 401, the second electrode 500 located on the second auxiliary light emitting layer 403 inside. A depth of the rut 310 is enough for accommodating the first auxiliary light emitting layer 401, the second auxiliary light emitting layer 403, the second electrode 500 inside, and the second electrode 500 which is a topside layer in the rut 310 is still lower than an upper surface of the rut 310.

The first electrode 200 can be an anode, and correspondingly, the second electrode 500 can be a cathode, and the first auxiliary light emitting layer 401 comprises a Hole Injection Layer and a Hole Transport Layer, and the second auxiliary light emitting layer 403 comprises an Electron Injection Layer and an Electron Transport Layer; alternatively, the first electrode 200 is a cathode, and correspondingly, the second electrode 500 is an anode, and the first auxiliary light emitting layer 401 comprises an Electron Injection Layer and an Electron Transport Layer, and the second auxiliary light emitting layer 403 comprises a Hole Injection Layer and a Hole Transport Layer.

Significantly, the first auxiliary light emitting layer 401, the second auxiliary light emitting layer 403 and the second electrode 500 inside the rut 310 and the first auxiliary light emitting layer 401, the second auxiliary light emitting layer 403 and the second electrode 500 on the first electrodes 200 and the pixel barrier layers 300 are cut and disconnected, and the depth of the rut 310 is enough so that the second electrode 500 which is a topside layer inside is still lower than an upper surface of the rut 310. Thus, the first auxiliary light emitting layer 401 is not continuous on the entire surface but naturally disconnected at the rut 310 due to the depth difference of the rut 310. That is to say, the leakage path between the two adjacent pixel areas is disconnected by the rut 310, and the leakage current generated between the two adjacent first electrodes 200 cannot be conducted via the first auxiliary light emitting layer 401. Accordingly, the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved.

Figure 2:
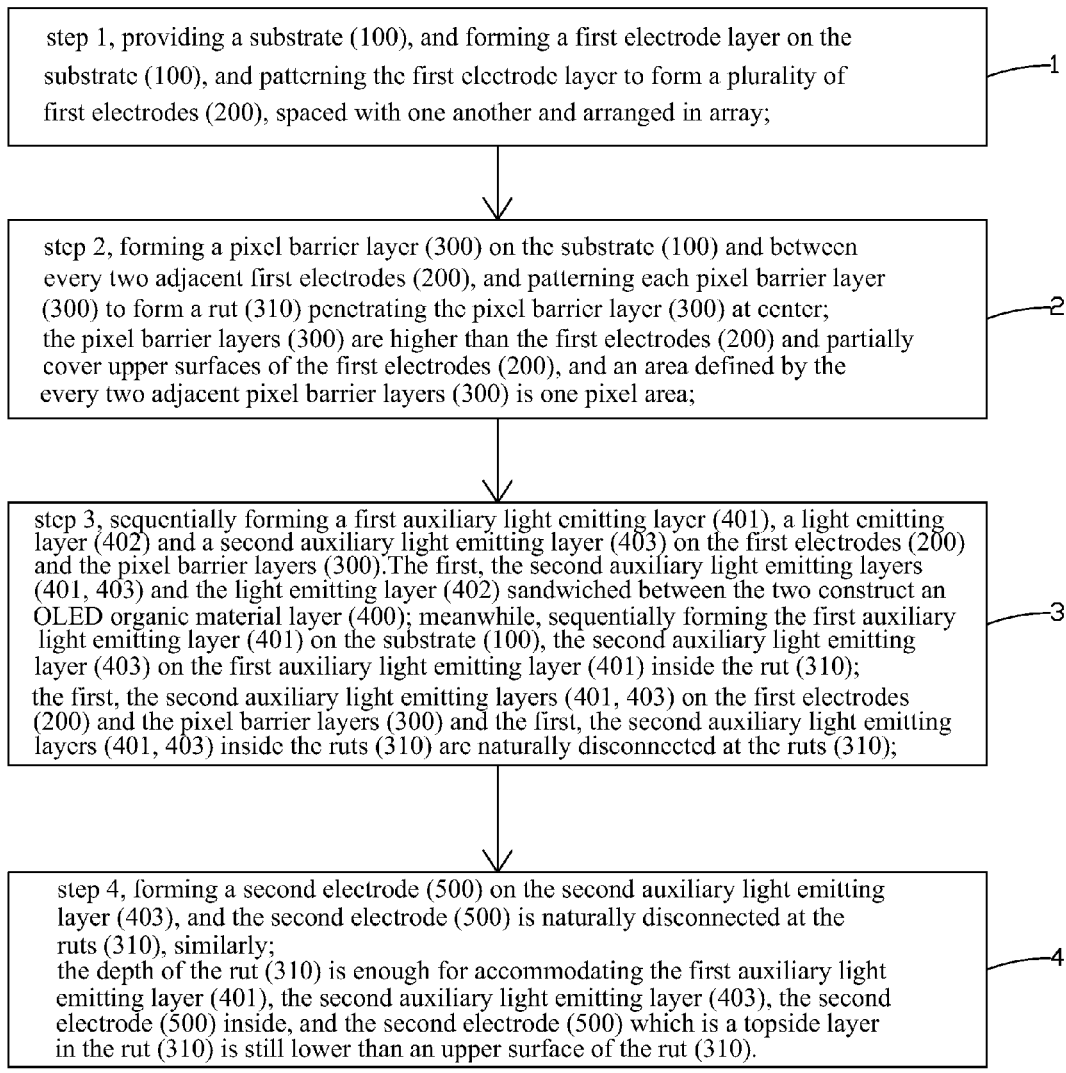
FIG. 2 is a flowchart of a manufacture method of an OLED display device according to the present invention.

Please refer to FIG. 2 in combination with FIG. 1. The present invention further provides a manufacture method of an OLED display device, comprising steps of:

step 1, providing a substrate 100, and forming a first electrode layer on the substrate 100, and patterning the first electrode layer to form a plurality of first electrodes 200, spaced with one another and arranged in array;

Specifically, the substrate 100 is a glass substrate, preferably, and the first electrode 200 can be an anode or a cathode.

step 2, forming a pixel barrier layer 300 on the substrate 100 and between every two adjacent first electrodes 200, and patterning each pixel barrier layer 300 to form a rut 310 penetrating the pixel barrier layer 300 at center.

Specifically, material of the pixel barrier layers 300 is insulation material.

The pixel barrier layers 300 are higher than the first electrodes 200 and partially cover upper surfaces of the first electrodes 200. The function of the pixel barrier layers 300 is to separate respective first electrodes 200 and an area defined by the every two adjacent pixel barrier layers 300 is one pixel area.

step 3, sequentially forming a first auxiliary light emitting layer 401, a light emitting layer 402 and a second auxiliary light emitting layer 403 on the first electrodes 200 and the pixel barrier layers 300. The first, the second auxiliary light emitting layers 401, 403 and the light emitting layer 402 sandwiched between the two construct an OLED organic material layer 400. Meanwhile, the first auxiliary light emitting layer 401 located on the substrate 100, the second auxiliary light emitting layer 403 located on the first auxiliary light emitting layer 401 are sequentially formed inside the rut 310.

The first, the second auxiliary light emitting layers 401, 403 on the first electrodes 200 and the pixel barrier layers 300 and the first, the second auxiliary light emitting layers 401, 403 inside the ruts 310 are naturally disconnected at the ruts 310.

Specifically, under circumstance that the first electrode 200 is an anode, the first auxiliary light emitting layer 401 comprises a Hole Injection Layer and a Hole Transport Layer, and the second auxiliary light emitting layer 403 comprises an Electron Injection Layer and an Electron Transport Layer; under circumstance that the first electrode 200 is a cathode, the first auxiliary light emitting layer 401 comprises an Electron Injection Layer and an Electron Transport Layer, and the second auxiliary light emitting layer 403 comprises a Hole Injection Layer and a Hole Transport Layer.

The light emitting layer 402 comprises a red light emitting layer 402R, a green light emitting layer 402G, a blue light emitting layer 402B which are orderly and circularly aligned.

step 4, forming a second electrode 500 on the second auxiliary light emitting layer 403, and the second electrode 500 is naturally disconnected at the ruts 310, similarly.

Furthermore, the depth of the rut 310 is enough for accommodating the first auxiliary light emitting layer 401, the second auxiliary light emitting layer 403, the second electrode 500 inside, and the second electrode 500 which is a topside layer in the rut 310 is still lower than an upper surface of the rut 310.

Under circumstance that the first electrode 200 is an anode, the second electrode 500 is a cathode; under circumstance that the first electrode 200 is a cathode, the second electrode 500 is an anode.

In the aforesaid manufacture method of the OLED display device, each pixel barrier layer 300 is patterned to form a rut 310 penetrating the pixel barrier layer 300 at center, and the first auxiliary light emitting layer 401, the emitting layer 402 and the second auxiliary light emitting layer 403 of the OLED organic material layer 400 are sequentially and continuously formed after the pixel barrier layer 300 is formed. At last, the second electrode 500 is formed on the second auxiliary light emitting layer 403. On one hand, the first auxiliary light emitting layer 401 is not continuous on the entire surface but naturally disconnected at the rut 310 due to the depth difference of the rut 310. That is to say, the leakage path between the two adjacent pixel areas is disconnected by the rut 310, and the leakage current generated between the two adjacent first electrodes 200 cannot be conducted via the first auxiliary light emitting layer 401. Accordingly, the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved; on the other hand, the first auxiliary light emitting layer 401 is formed after the pixel barrier layer 300, and then no damage occurs to the first auxiliary light emitting layer 401, and besides, the first auxiliary light emitting layer 401, the emitting layer 402, the second auxiliary light emitting layer 403 and the second electrode 500 are continuously formed, thus, the interface issues can be decreased.

In conclusion, in the OLED display device of the present invention, by locating the penetrating rut at the center of the pixel barrier layer to disconnect the OLED organic material layer at the rut, the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved; in the manufacture method of the OLED display device of the present invention, by patterning each pixel barrier layer to form the rut penetrating the pixel barrier layer at center, and sequentially and continuously forming the first auxiliary light emitting layer, the emitting layer and the second auxiliary light emitting layer of the OLED organic material layer after the pixel barrier layer is formed and at last, the second electrode is formed on the second auxiliary light emitting layer, on one hand, no damage occurs to the first auxiliary light emitting layer 401, and the interface issues are decreased, and on the other hand, the leaking emitting light problem caused by the leakage current can be inhibited under circumstance that the efficiency of the luminescent material is not reduced and the resolution of the display device is not degraded. The short circuit defects can be decreased, and the reliability of the OLED display device is promoted and the display quality of the OLED display device is improved.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) display device, comprising:
    a substrate;
    a plurality of first electrodes, which is spaced with one another and arranged in an array on the substrate;
    pixel barrier layers, each of which is located on the substrate and between every two adjacent ones of the first electrodes; the pixel barrier layers are higher than the first electrodes and partially cover upper surfaces of the first electrodes; wherein each of the pixel barrier layers comprises a rut formed in a center of the pixel barrier layer and penetrating the pixel barrier layer; and an area defined by every two adjacent ones of the pixel barrier layers is one pixel area;
    an OLED organic material layer, which is located on the first electrodes and the pixel barrier layers; and the OLED organic material layer is disconnected at the ruts;
    a second electrode, which is located on the OLED organic material layer; and the second electrode is disconnected at the ruts.

2. The OLED display device according to claim 1, wherein the pixel barrier layers are formed of an insulation material.

3. The OLED display device according to claim 1, wherein the OLED organic material layer comprises: a first auxiliary light emitting layer, a second auxiliary light emitting layer and a light emitting layer located between the first and the second auxiliary light emitting layers.

4. The OLED display device according to claim 3, wherein the ruts comprise: a first auxiliary light emitting layer located on the substrate, a second auxiliary light emitting layer located on the first auxiliary light emitting layer, and a second electrode located on the second auxiliary light emitting layer inside; the ruts having a depth that is enough for accommodating the first auxiliary light emitting layer, the second auxiliary light emitting layer, and the second electrode therein such that the second electrode which is a topside layer in the rut is lower than an upper surface of the rut.

5. The OLED display device according to claim 3, wherein the light emitting layer comprises a red light emitting layer, a green light emitting layer, and a blue light emitting layer which are orderly and cyclically arranged.

6. The OLED display device according to claim 3, wherein the first electrode is an anode or a cathode, and correspondingly, the second electrode is a cathode or an anode.

7. The OLED display device according to claim 6, wherein the first auxiliary light emitting layer comprises a hole injection layer and a hole transport layer, or an electron injection layer and an electron transport layer, and correspondingly, the second auxiliary light emitting layer comprises an electron injection layer and an electron transport layer, or a hole injection layer and a hole transport layer.

8. A manufacture method of an organic light emitting diode (OLED) display device, comprising steps of:
    step 1, providing a substrate, forming a first electrode layer on the substrate, and patterning the first electrode layer to form a plurality of first electrodes, which is spaced with one another and arranged in an array on the substrate;
    step 2, forming a pixel barrier layer on the substrate and between every two adjacent ones of the first electrodes, and patterning each pixel barrier layer to form a rut penetrating the pixel barrier layer in a center thereof;
    wherein the pixel barrier layers are higher than the first electrodes and partially cover upper surfaces of the first electrodes; and an area defined by every two adjacent ones of the pixel barrier layers is one pixel area;
    step 3, sequentially forming a first auxiliary light emitting layer, a light emitting layer and a second auxiliary light emitting layer on the first electrodes and the pixel barrier layers, such that the first and the second auxiliary light emitting layers and the light emitting layer sandwiched therebetween construct an OLED organic material layer; meanwhile, sequentially forming a first auxiliary light emitting layer on the substrate and a second auxiliary light emitting layer on the first auxiliary light emitting layer;
    wherein the first and the second auxiliary light emitting layers that are on the first electrodes and the pixel barrier layers are disconnected from the first and the second auxiliary light emitting layers that are located inside the ruts; and
    step 4, forming a second electrode on the second auxiliary light emitting layers such that the second electrode is disconnected at the ruts;
    wherein the ruts have a depth that is enough for accommodating the first auxiliary light emitting layer, the second auxiliary light emitting layer, and the second electrode therein such that the second electrode which is a topside layer in the rut is lower than an upper surface of the rut.

9. The manufacture method of the OLED display device according to claim 8, wherein the pixel barrier layers are formed of an insulation material.

10. The manufacture method of the OLED display device according to claim 8, wherein the light emitting layer comprises a red light emitting layer, a green light emitting layer, and a blue light emitting layer which are orderly and cyclically arranged;
    the first electrode is an anode or a cathode, and correspondingly, the second electrode is a cathode or an anode;
    the first auxiliary light emitting layer comprises a hole injection layer and a hole transport layer, or an electron injection layer and an electron transport layer, and correspondingly, the second auxiliary light emitting layer comprises an electron injection layer and an electron transport layer, or a hole injection layer and a hole transport layer.

11. A manufacture method of an organic light emitting diode (OLED) display device, comprising steps of:
    step 1, providing a substrate, forming a first electrode layer on the substrate, and patterning the first electrode layer to form a plurality of first electrodes, which is spaced with one another and arranged in an array on the substrate;
    step 2, forming a pixel barrier layer on the substrate and between every two adjacent ones of the first electrodes, and patterning each pixel barrier layer to form a rut penetrating the pixel barrier layer in a center thereof;
    wherein the pixel barrier layers are higher than the first electrodes and partially cover upper surfaces of the first electrodes; and an area defined by every two adjacent ones of the pixel barrier layers is one pixel area;
    step 3, sequentially forming a first auxiliary light emitting layer, a light emitting layer and a second auxiliary light emitting layer on the first electrodes and the pixel barrier layers, such that the first and the second auxiliary light emitting layers and the light emitting layer sandwiched therebetween construct an OLED organic material layer; meanwhile, sequentially forming a first auxiliary light emitting layer on the substrate and a second auxiliary light emitting layer on the first auxiliary light emitting layer;
    wherein the first and the second auxiliary light emitting layers that are on the first electrodes and the pixel barrier layers are disconnected from the first and the second auxiliary light emitting layers that are located inside the ruts; and
    step 4, forming a second electrode on the second auxiliary light emitting layers such that the second electrode is disconnected at the ruts;
    wherein the ruts have a depth that is enough for accommodating the first auxiliary light emitting layer, the second auxiliary light emitting layer, and the second electrode therein such that the second electrode which is a topside layer in the rut is lower than an upper surface of the rut;
    wherein the pixel barrier layers are formed of an insulation material;
    wherein the light emitting layer comprises a red light emitting layer, a green light emitting layer, and a blue light emitting layer which are orderly and cyclically arranged;
    the first electrode is an anode or a cathode, and correspondingly, the second electrode is a cathode or an anode;
    the first auxiliary light emitting layer comprises a hole injection layer and a hole transport layer, or an electron injection layer and an electron transport layer, and correspondingly, the second auxiliary light emitting layer comprises an electron injection layer and an electron transport layer, or a hole injection layer and a hole transport layer.

* * * * *